United States Patent [19]

Martino, Jr. et al.

[11] 4,401,897

[45] Aug. 30, 1983

[54] SUBSTRATE BIAS VOLTAGE REGULATOR

[75] Inventors: William L. Martino, Jr.; Jerry D. Moench, both of Austin, Tex.

[73] Assignee: Motorola, Inc., Schaumburg, Ill.

[21] Appl. No.: 244,832

[22] Filed: Mar. 17, 1981

[51] Int. Cl.[3] ...................... H03L 5/00; H03K 17/693

[52] U.S. Cl. .................................... 307/297; 307/304

[58] Field of Search ......................... 307/296, 297, 304

[56] References Cited

U.S. PATENT DOCUMENTS

| | | | |
|---|---|---|---|
| 4,142,114 | 2/1979 | Green | 307/297 X |
| 4,307,333 | 12/1981 | Hargrove | 307/304 X |
| 4,311,923 | 1/1982 | Lüscher et al. | 307/297 X |
| 4,336,466 | 6/1982 | Sud et al. | 307/297 |

OTHER PUBLICATIONS

Harroun, "Substrate Bias Voltage Control", *IBM Tech. Disc. Bull.*, vol. 22, No. 7, 12-1979, pp. 2691-2692.

Jacobson, "Threshold Detector", *IBM Tech. Disc. Bull.*, vol. 22, No. 7, 12-1979, pp. 2765-2767.

*Primary Examiner*—Larry N. Anagnos
*Assistant Examiner*—David R. Hudspeth
*Attorney, Agent, or Firm*—Anthony J. Sarli, Jr.; Jeffrey Van Myers; James L. Clingan, Jr.

[57] ABSTRACT

A substrate bias voltage regulator selectively provides one of two predetermined substrate bias voltage levels in response to a timing signal. The selection of substrate bias voltage level is achieved via a reference generator circuit which provides one of two predetermined reference voltages to a control circuit which regulates the substrate bias voltage to the selected level.

8 Claims, 2 Drawing Figures

SUBSTRATE BIAS VOLTAGE REGULATOR

TECHNICAL FIELD

The invention relates to substrate bias voltage regulators in a semiconductor device.

BACKGROUND ART

In the design of high performance random access memories (RAMS) the use of a negative substrate bias voltage has become common. To minimize the printed circuit board space required for using the devices, it is desirable to generate the substrate bias voltage on the chip. One regulator circuit for providing a substrate bias voltage is described in pending U.S. patent application Ser. No. 017,523, now abandoned, filed Mar. 5, 1979, and assigned to the assignee of the instant invention.

The characteristics of present on-chip regulators result in certain problems in the operation of high performance RAMS. Typically, in high performance RAMS there is a portion of a read or write cycle during which all of the bit sense lines are precharged to the supply voltage or very close to it. During another portion of the cycle, called the active portion of the cycle, when the read or write function is actually performed, one half of the bit sense lines are discharged in an action for performing the read or write. A bit sense line in a typical memory device has a large parasitic capacitance to the substrate which couples the precharging and discharging current to the substrate. Because on-chip substrate bias voltage regulators typically have high output impedance, the coupling of the precharging and discharging currents to the substrate via stray capacitance has a significant effect on the substrate voltage.

When one half the lines are discharged, the substrate voltage is lowered to a more negative voltage. A typical substrate bias voltage regulator has a pump which operates to drive the substrate to a negative voltage. When the substrate reaches the desired negative voltage, the pump is turned off. When the substrate rises above the desired voltage, the pump is turned back on until the desired level is reached again. As a consequence of this type of operation, when the substrate is approximately at the desired level and a discharge of one half of the bit sense lines occurs which drives the substrate significantly more negative than the desired level, the regulator does not have any way of bringing the substrate back up to the desired level other than through leakage current and current through a control circuit to the substrate which is intentionally minimized. Consequently the substrate voltage varies during virtually the entire active portion of the cycle, the time when information is being either read or written. Because device characteristics vary with substrate bias voltage, it is important to have a steady substrate bias voltage.

When the bit sense lines are precharged, the substrate bias voltage is raised which has one of the potential dangers of forward biasing P/N junctions which exist between the substrate, which may be of a P-doped material, and source and drain which may be of an N-doped material, of the transistors. One of the purposes of providing a negative substrate bias voltage is to avoid forward biasing which injects carriers into the substrate where they can migrate to the memory cell array with the potential of causing the loss of information stored therein. When the active portion of the cycle is long compared to the precharge portion over a sufficient number of cycles to allow the substrate bias voltage to reach a regulated level during the active portion, the consequent positive shift due to precharging then brings the substrate bias voltage to the level which will present the highest danger of forward biasing P/N junctions.

To compensate for the discharge of one half of the bit sense lines by providing dummy lines to charge simultaneously to exactly offset the effect of the discharge, requires a substrate increase in chip area which, of course, is undesirable. To provide a substrate bias voltage generator with sufficiently low output impedance to render the shifts in substrate voltage negligible would also require very significant increases in chip area as well as a substantial increase in the total power dissipation of the RAM.

The instant invention provides a practical solution to providing a more efficient on-chip substrate bias voltage regulator, one objective of which is to hold the substrate bias voltage at a relatively constant level during the active portion of the cycle and another objective of which is to maintain the substrate bias voltage sufficienty negative to ensure that the P/N junctions, of which the substrate is part, are forward biased.

BRIEF SUMMARY OF THE INVENTION

These and other objects and advantages are provided by an improved regulator circuit for generating a substrate bias voltage. The substrate bias voltage regulator which, in response to a control signal, will pump the substrate to a more negative level than its regulated rate during other than the active cycle of the memory. The control signal is provided by a substrate bias voltage control circuit which is coupled to a reference terminal and connected directly to the substrate. The control signal is provided in proportion to the difference between the substrate bias voltage and a voltage at the reference terminal.

The voltage at the reference terminal is provided by a reference voltage generator which is coupled to the substrate bias voltage control circuit at the reference terminal. The reference voltage is provided at a first predetermined level in response to receiving a reference control signal at a first state and at a second predetermined level in response to receiving the reference control at a second state.

Because the substrate bias voltage control circuit provides the control signal in proportion to the difference between the reference voltage and the substrate bias voltage, the substrate bias voltage generator will be caused to generate a substrate bias voltage which is proportional to the reference voltage.

The ability to selectively provide one of two regulated substrate bias voltages in response to a signal allows for the correction of the harmful effects of the shifts in the substrate bias voltage caused by precharging and discharging bit sense lines.

DETAILED DESCRIPTION OF THE PREFERRED EMBODIMENT

Figure 1:
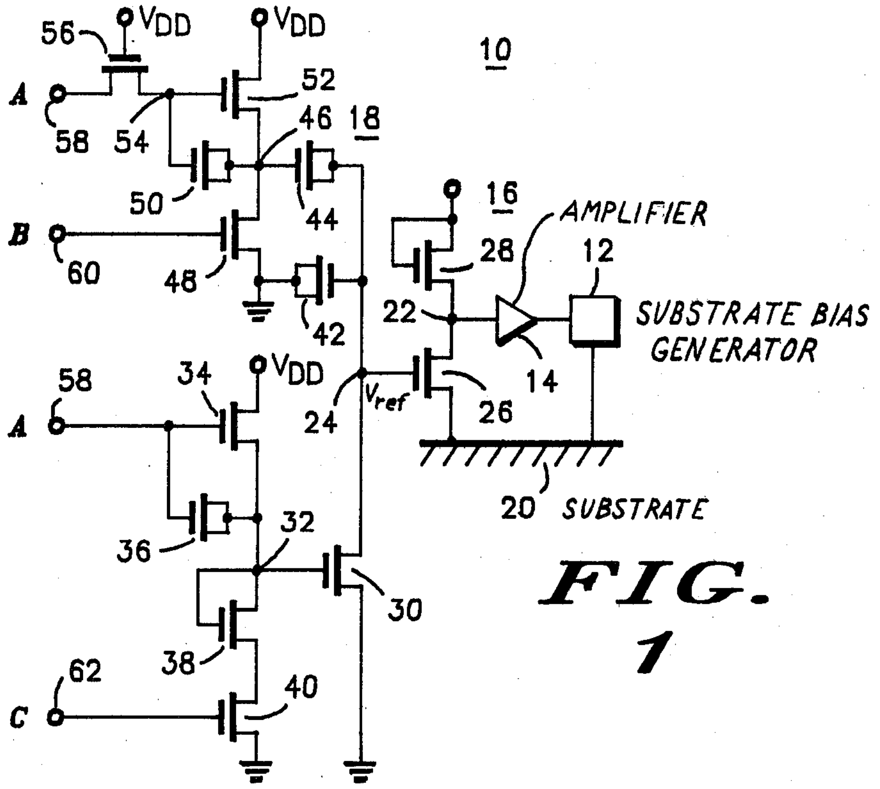
FIG. 1 is a schematic diagram of a control circuit according to the invention.

The invention is shown in a preferred embodiment in circuit 10 in FIG. 1. Circuit 10 comprises a substrate bias voltage generator 12, an amplifier 14, a substrate bias voltage control circuit 16, and a reference voltage generator 18. The substrate bias voltage generator 12 generates a negative voltage and has means associated therewith to connect this negative voltage to substrate 20. The substrate bias voltage generator has an input for receiving a control signal which control whether or not substrate 20 is pumped more negatively. Such a substrate bias voltage generator is well known in the art.

The substrate bias control circuit 16 provides an output at node 22 to amplifier 14 which is proportional to the difference between a reference voltage $V_{ref}$ at node 24 sensed by a gate of transistor 26 and the substrate bias voltage on a source of transistor 26. The source of transistor 26 is connected directly to the substrate 20. This connection is an ohmic contact which is independent and separate from the P/N junction which is formed by virtue of the source being in physical contact with the substrate. This ohmic connection can be made in any number of ways which are well known in the art. The output at node 22 is coupled to the generator 12 via amplifier 14 and thereby is the control signal for the generator.

Amplifier 14 has a threshold voltage which when exceeded by the voltage at node 22 will cause amplifier 14 to provide the control signal to generator 12 which will then begin pumping the substrate in a more negative direction. Such an amplifier is well known in the art.

Control circuit 16 comprises insulated gate field effect transistors 26 and 28, each having a gate, source and drain. The gate of transistor 26 is connected to the reference circuit 18 at node 24. The source of transistor 26 is connected directly to the substrate, bypassing the P/N junction there. The drain of transistor 26 is connected to the source of transistor 28 to form node 22. The gate and drain of transistor 28 are connected to positive power supply $V_{DD}$. Transistors 26 and 28 each have a threshold voltage $V_T$ which is equal to the threshold voltage of amplifier 14. Transistor 26 is made to have a gain factor g four times greater than that of transistor 28. If the reference voltage $V_{ref}$ on node 24 is at ground potential, the control circuit will regulate the substrate bias voltage to a level of minus one half $V_{DD}$. In the preferred embodiment $V_{DD}$ is nominally 5 volts. Consequently, the substrate bias voltage $V_{bb}$ is nominally −2.5 volts when node 24 is at ground potential.

Both transistors 26 and 28 are operated in saturation where the following equation describes the relationship between the drain to source current $I_{DS}$, the gain factor g associated with the transistor, the threshold voltage $V_T$, and the gate to source voltage $V_{GS}$:

$$I_{DS}=g(V_{GS}-V_T)^2$$

For the control circuit to provide regulation, node 22 is at the threshold voltage of the amplifier 14, $V_T$. Consequently, the equation describing the drain to source current $I_{DS28}$ through transistor 28 is $$I_{DS28}=g_{28}(V_{DD}-V_T-V_{T28})^2.$$

The equation describing the drain to source current $I_{DS26}$ through transistor 26 is $I_{DS26}=g_{26}(-V_{ref}-V_{BB}-V_{T26})$. Because the gain factor $g_{26}$ of transistor 26 is four times greater than that of transistor 28, $$I_{DS26}=4g_{28}(V_{ref}-V_{BB}-V_{T28})^2.$$

Because the threshold voltages $V_{T26}$ and $V_{T28}$ are equal to the threshold voltage $V_T$ of amplifier 14, $$I_{DS26}=4g_{28}(V_{ref}-V_{BB}-V_T)^2$$

and $$I_{DS28}=g_{28}(V_{DD}-2V_T)^2.$$

Because the drain to source current through transistor 26 is the same as through transistor 28, $$g_{28}(V_{DD}-2V_T)^2=4g_{28}(V_{ref}-V_{BB}-V_T)^2.$$

Both sides can be divided by $g_{28}$ as follows:

$$(V_{DD}-2V_T)^2=4(V_{ref}-V_{BB}-V_T)^2.$$

The positive square root of both sides can be taken as follows:

$$V_{DD}-2V_T=2(V_{ref}-V_{BB}-V_T) \text{ or}$$

$$V_{DD}-2V_T=2V_{ref}-2V_{BB}-2V_T.$$

Solving for $V_{BB}$ implies $$V_{BB}=V_{ref}-\tfrac{1}{2}V_{DD}.$$

If the reference voltage $V_{ref}$ on node 22 is at ground potential, then $$V_{BB}=-\tfrac{1}{2}V_{DD}.$$

So long as the transistors 26 and 28 remain in saturation, the prior equations describe the proportionality of the regulated substrate bias voltage $V_{BB}$ to the reference voltage $V_{ref}$ on node 22. The condition for saturation is that the drain to source voltage must be greater than the gate to source voltage minus the threshold voltage. For control circuit 16 both transistors 26 and 28 will remain in saturation so long as the reference voltage on node 22 is less than two threshold voltages. Reference may be made to the previously noted U.S. patent application Ser. No. 017,523 for more detail.

The prior described equations show that a shift in the reference voltage $V_{ref}$ will cause a shift of the same magnitude and direction to the regulated substrate bias voltage.

Figure 2:
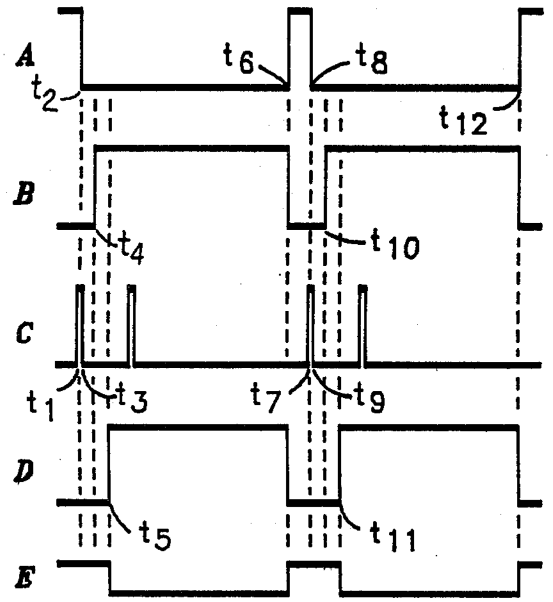
FIG. 2 is a timing diagram useful in understanding the operation of the circuit of FIG. 1.

In the preferred embodiment, the regulator circuit 10 is located on a semiconductor chip which also has a random access memory which causes shifts in the substrate bias voltage. These shifts are predictable in both timing and magnitude. All bit sense lines are precharged during a precharge portion of a cycle. One half of the bit sense lines are discharged during an active portion of the cycle which causes the substrate bias voltage to shift more negative by approximately 0.8 volt. In FIG. 2, signal A shows the active and precharge portions of the cycle. The active portions are when the signal is low, such as between times t2 and t6 and between times t8 and t12. Signals A, B, C and D are nominally at zero volts in the low condition and nominally at the power supply voltage $V_{DD}$ in the high condition.

When signal D rises at time t5, the discharge of one half of the bit sense lines occurs which drives the substrate approximately 0.8 volt more negative. Approximately 50 nanoseconds prior to time t5, at time t4 shown on signal B, the reference voltage on node 24 is lowered from approximately zero volt to approximately −0.8 volt which in turn causes the control circuit 16 to try to regulate to a level 0.8 volt more negative. Even though the control circuit 16 is trying to regulate the substrate 20 to a more negative voltage between between times t4 and t5, the effect of the generator 12 on the substrate bias voltage in that small time frame is negligible. At time t5 one half of the bit sense lines are discharged which causes the substrate to be driven the 0.8 volt more negative. From time t5 until the end of the active portion of the cycle, regardless of how long this portion is, the substrate bias voltage is regulated by control circuit 16 at 0.8 volt more negative than during the precharge portion of the cycle.

At time t6 the precharge portion of the cycle begins at which time the bit sense lines are precharged which causes a positive shift in the substrate bias voltage of 0.8 volts. At this time t5, the reference voltage on node 22 is reduced by approximately 0.8 volts to approximately zero volts which in turn raises the voltage to which the control circuit is trying to regulate by 0.8 volt to $-\frac{1}{2}$ $V_{DD}$. Because $V_{DD}$ is nominally 5 volts, the substrate bias voltage is alternately regulated between −2.5 volts and −3.3 volts. The substrate bias voltage is shown in FIG. 2 as signal E.

Reference circuit 18 selectively provides one of two reference voltages on node 22 to the control circuit. The selection is controlled by timing signals A, B and C. The difference between the two reference voltages is chosen to be 0.8 so as to provide the control circuit with the difference necessary for it to match the shifts in the substrate voltage caused by the precharging and discharging of the bit sense lines. Timing signals A, B and C are chosen for a timing relationship each has with the shifts in substrate bias voltage.

An externally provided signal RAS defines the active and precharge portions of the cycle. RAS or Row Address Strobe, as well as the other timing signals used herein either already exist or are derived from signals which already exist in typical RAM designs. Their provision and use is well known in the art. Signal A is in phase with RAS, but its falling edge, at times t2 and t8, is delayed approximately 15 nanoseconds. Signal B is in phase with RAS but of opposite polarity but its rising edge, at times t4 and t10, is delayed approximately 45 nanoseconds. Signal C is an address latch which provides two pulses, both occurring during the active portion of the cycle. The first pulse, the only one of relevance to the instant invention, occurs at time t1, approximately 6 nanoseconds before the falling edge of signal A at time t2. The pulse lasts approximately 12 nanoseconds until time t3. Signal D is a sense amplifier clock which initiates the discharge of one half of the bit sense lines at time t5. The common edge of signals A, B, C and D at times t6 and t12 is the time the bit sense lines are precharged. In the reference circuit 18 shown in the circuit diagram of FIG. 1, a transistor 30 has its drain connected to node 24, its source connected to ground, and a gate connected to node 32. A transistor 34 has its drain connected to the positive power supply $V_{DD}$, its source connected to node 32, and its gate connected to a terminal 58. A depletion mode transistor 36 is connected as a capacitor in a well known manner. Transistor 36 has its gate connected to terminal 58, and a source and drain connected together and to node 32. A transistor 38 has its drain and gate connected to node 32 and has a source. Transistor 40 has its gate connected to a terminal 62, its source connected to ground, and its drain connected to the source of transistor 38.

A depletion mode transistor 42 is connected as a capacitor, havings its gate connected to node 24 and its source and drain connected together and to ground. A depletion mode transistor 44 connected as a capacitor has its gate connected to a node 46 and its source and drain connected together and to node 24. A transistor 48 has its drain connected to node 46, its gate connected to a terminal 60, and its source connected to ground. Transistor 50 is a depletion mode transistor connected as a capacitor having its gate connected to a node 54 and its source and drain connected together and to node 46. A transistor 52 has its drain connected to $V_{DD}$, its gate connected to node 54, and a source connected to node 46. Transistor 56 has its drain connected to the terminal 58, its gate connected to $V_{DD}$, and its source connected to node 54.

The operation of the reference circuit 18 is as follows. During the precharge portion of the cycle, node 24 is held to approximately zero volts by transistor 30. Signal A at terminal 58 is high, so transistor 34 is on which brings node 32 high. Signal C at terminal 62 is low which holds transistor 40 off.

At the onset of the active portion of the cycle signal C goes high at time t1 as shown in FIG. 2. This causes transistor 40 to turn on. Because transistor 38 has its gate connected to node 32, node 32 will drop to a threshold voltage of transistor 38. Transistors 30 and 38 as well as transistors 40, 34, 48, 52 and 56 have the same threshold voltage of approximately 0.7 volt. Transistor 30 is marginally on at this point so that a slight voltage decrease will completely turn it off. At time t2 signal A at terminal 58 goes low which turns off transistor 34 and drives node 32 negative via transistor 36 which is acting as a capacitor. Node 32 going negative turns off transistor 38 which cannot conduct current to node 32 through its gate. Because signal A drops by approximately 5 volts at time t2, the tendency is to drive node 32 to a negative 5 volts plus one threshold voltage which was on the node just prior to the transition. Transistor 34, however, clamps node 32 to one threshold voltage below ground. The gate of transistor 34 is at approximately zero volts so any voltage at node 32 more negative than one threshold voltage will turn transistor 34 on.

Because the reference level at node 24 will be going to approximately −0.8 volt, transistor 30 would turn on if its gate, node 32, were not some negative voltage. With node 32 at one negative threshold node 24 can be no more negative than two thresholds because transistor 30 will turn on otherwise. At time t3, signal C goes low; however, as long as node 32 is negative, transistor 40 is irrelevant to circuit operation because transistor 38 acts as a blocking diode.

When signal A goes low at time t2, transistor 56 turns on bringing node 54 low which turns off transistor 52. During the precharge portion of the cycle node 46 is at approximately the positive power supply voltage $V_{DD}$. When node 54 goes low at time t2, it is capacitively coupled to node 46. The capacitance of transistors 44 and 42, however, is made sufficiently larger than the capacitance of transistor 50 so that the effect of this coupling on node 46 is negligible. Node 46 remains at approximately $V_{DD}$ until signal B applied then to terminal 60 goes high at time t4 at which time transistor 48 turns on which brings node 46 to approximately zero volts. Because node 24 was at approximately zero volts just prior to time t4, node 24 is driven to a negative voltage by virtue of the charge sharing effect between the capacitances of transistors 42 and 44. The desired voltage is −0.8 volt which is achieved by selecting the proper ratio of the capacitances C16 and C18 of transistors 42 and 44. The formula for the voltage at node 24, $V_{24}$ is as follows:

$$V_{24} = \frac{C_{44}(\Delta V)}{C_{42} + C_{44}}$$

The desired $V_{24}$ is −0.8 v with V at 5 volts so the equation becomes:

$$.8 = \frac{C_{44} \times 5}{C_{42} + C_{44}}$$

$$.8C_{42} + .8C_{44} = 5C_{44}$$
$$.8C_{42} = 4.2C_{44}$$

$$\frac{C_{42}}{C_{44}} = \frac{4.2}{.8} = 5.25$$

Consequently, the capacitance of transistor 42 is made 5.25 times larger than the capacitance of transistor 44.

The voltage at node 24 remains at −0.8 volts until time t6 when signal A goes high turning on transistor 34 which brings node 32 high which turns on transistor 30 which brings node 50 to approximately zero volts. Signal C remains low so that it has no effect on node 32.

At time t6, signal b goes low turning off transistor 48 which allows node 46 to go high. Signal A goes high which brings node 54 high. Node 46 remains low for a short time after node 54 goes high because of the very large capacitance of transistor 44. As node 46 begins to rise in voltage by virtue of transistor 52 being on and transistor 48 being off, node 54 also begins to rise due to the capacitive coupling by transistor 50. Node 54 rises to several volts above the positive power supply voltage. If node 54 was only driven by signal A, the voltage at node 46 would be lower and less predictable in that it would be dependent on the magnitude of signal A and would be reduced by the threshold voltage of transistor 52. The charge sharing mechanism would provide a negative voltage at node 24 if transistor 48 was disconnected and signal A was applied directly to the gate of transistor 44. Likewise signal A could be applied directly to the gate of transistor 30 without using signal C and the circuit would provide two different reference voltages in timely fashion. The circuit described, however, is for optimum operation.

After time t6 the circuit remains in the precharge portion of the cycle until time t7 at which time the sequence beginning at time t1 repeats itself.

For a given layout and process of a device, the magnitude of the in bias voltage during a precharge or discharge shift is repeatable. The first of the two regulated substrate bias voltages is provided until the discharge of one half of the bit sense lines occurs at which times the second of the two regulated substrate bias voltages is provided to match the resultant shift in substrate bias voltage. The substrate bias voltage is then held at a constant level during the active portion of the cycle. At the termination of the active portion, the bit sense lines are precharged which drives the substrate bias voltage more positive. Although all the bit sense lines are precharged, one half are already charged, consequently the magnitude of the shift of the substrate bias voltage caused by the precharge is the same as that caused by the discharge. Therefore the shift in the substrate bias voltage due to precharging the bit sense lines simply brings the substrate bias voltage back to the level of the first of two regulated substrate bias voltages. The first of two regulated substrate bias voltages is then provided during the precharge portion of the cycle.

The result is a sufficiently negative voltage during the precharge portion of the cycle to ensure against forward biasing P/N junctions and a constant voltage during the active portion of the cycle.

While the invention has been described in a preferred embodiment it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

We claim:

1. In a substrate bias voltage regulator comprising:

substrate bias voltage generator means for generating a substrate bias voltage related to a control voltage; and substrate bias voltage control means coupled to the substrate bias voltage generator means and to the substrate, for comparing the bias voltage generated on the substrate to a reference voltage, and for providing a control voltage for application to the substrate bias voltage generator in proportion to the difference between said reference voltage and said sensed bias voltage;

reference voltage generator means coupled to the substrate bias voltage control means and to a reference control terminal, for receiving a reference control signal via the reference control terminal, for providing the reference voltage at a first predetermined level in response to the received reference control signal having a first state, and for providing the reference voltage at a second predetermined level in response to that received reference control signal having a second state.

2. The substrate bias voltage regulator of claim 1 wherein the reference voltage generator further comprises:

charge sharing means having an output coupled to the substrate bias control means and an input coupled to the reference control terminal for providing the reference voltage at the first predetermined level in response to the received reference control signal having the first state.

3. The substrate bias voltage regulator of claim 2 wherein the charge sharing means comprises:

a first capacitance means coupled between the substrate bias voltage control means and the reference control terminal for capacitively coupling the received reference control signal to the substrate bias voltage control means and a second capacitance means coupled between the substrate bias voltage control means and a ground terminal for providing capacitance therebetween.

4. The substrate bias voltage regulator of claim 3 wherein the reference voltage generator further comprises first predetermined level buffer means interposed between the reference control terminal and the charge sharing means for buffering the received reference control signal and for delaying the providing of the reference voltage at the first predetermined level by a predetermined time after the received reference control signal has the first state.

5. The substrate bias voltage regulator of claim 4 wherein the first predetermined level buffer means comprises:

a delay control terminal for receiving a delay control signal which assumes a first state at a predetermined time after the received reference control signal has the first state;

a first transistor having a gate coupled to the delay control terminal, a source coupled to the ground terminal, and a drain coupled to the input of the charge sharing means;

a second transistor having a gate, a source coupled to the drain of the first transistor, and a drain coupled to a power supply terminal;

a first capacitive coupler means coupled between the source and gate of the second transistor for providing capacitance therebetween, and;

a third transistor having a drain coupled to the reference control terminal, a source coupled to the gate of the second transistor, and a gate coupled to the power supply terminal.

6. The substrate bias voltage regulator of claim 5 wherein the reference voltage generator means further comprises:

a fourth transistor having a gate, a source coupled to a ground terminal, and a drain coupled to the substrate bias voltage control means;

a fifth transistor having a source coupled to the gate of the fourth transistor, a drain coupled to the power supply terminal, and a gate coupled to the reference control terminal;

a second capacitive coupler means coupled between the source and gate of the fifth transistor for providing capacitance therebetween;

a sixth transistor having a drain and gate coupled together and to the gate of the fourth transistor and having a source;

a disable control terminal for receiving a disable control signal at a predetermined time before the received reference control signal has the first state; and a seventh transistor having a gate coupled to the disable control terminal, a source coupled to ground, and a drain coupled to the source of the sixth transistor.

7. The substrate bias voltage regulator of claim 1 wherein the reference voltage generator further comprises a second predetermined level buffer means coupled between the reference control terminal and the substrate bias voltage control means for providing the reference voltage at the second predetermined level in response to the received reference control signal having the second state.

8. The substrate bias voltage regulator of claim 7 wherein the second predetermined level buffer means comprises a transistor having a gate coupled to the reference control terminal, a source coupled to a ground terminal, and a drain coupled to the substrate bias voltage control means.

* * * * *